United States Patent
Gadat et al.

(10) Patent No.: US 11,005,691 B2
(45) Date of Patent: May 11, 2021

(54) METHOD AND RECEIVER DEVICE FOR ESTIMATING A FREQUENCY OFFSET AND A FREQUENCY DRIFT OF A USEFUL SIGNAL

(71) Applicant: AIRBUS DEFENCE AND SPACE SAS, Toulouse (FR)

(72) Inventors: Benjamin Gadat, Toulouse (FR); Mehdi Anteur, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 0 days.

(21) Appl. No.: 16/759,238

(22) PCT Filed: Oct. 22, 2018

(86) PCT No.: PCT/EP2018/078823
§ 371 (c)(1),
(2) Date: Apr. 24, 2020

(87) PCT Pub. No.: WO2019/081392
PCT Pub. Date: May 2, 2019

(65) Prior Publication Data
US 2020/0396111 A1    Dec. 17, 2020

(30) Foreign Application Priority Data

Oct. 25, 2017    (FR) ...................... 1760067

(51) Int. Cl.
*H04L 27/00*    (2006.01)
*G01R 23/02*    (2006.01)
*H04B 7/185*    (2006.01)

(52) U.S. Cl.
CPC .......... *H04L 27/0014* (2013.01); *G01R 23/02* (2013.01); *H04B 7/18513* (2013.01);
(Continued)

(58) Field of Classification Search
CPC ......... H04L 27/0014; H04L 2027/0024; H04L 2027/0026; H04L 2027/0034;
(Continued)

(56) References Cited

U.S. PATENT DOCUMENTS 6,249,539 B1 *   6/2001   Harms ................. H04B 7/216
                                                    375/130
8,675,788 B2 *   3/2014   Andgart .............. H04L 27/2657
                                                    375/344

(Continued)

FOREIGN PATENT DOCUMENTS

CN    106817333    6/2017

OTHER PUBLICATIONS

Michael P. Fitz, "Planar Filtered Techniques for Burst Mode Carrier Synchronization", Institute of Electrical and Electronics Engineers, Countdown to the New Milennium, Proceedings of the Global Telecommunications Conference (GLOBECOM), Dec. 2, 1991, pp. 0365-0369.

(Continued)

*Primary Examiner* — Betsy Deppe
(74) *Attorney, Agent, or Firm* — Nixon & Vanderhye P.C.

(57) ABSTRACT

A method (50) for estimating a frequency shift and a frequency drift affecting a useful signal including a code word formed by a channel encoder, including an analysis phase (51) including: for two analysis frequency drifts: a compensation (52) of the analysis frequency drift on the useful signal, an estimation (53) of the frequency shift on each useful signal obtained after compensation, a selection (54) of frequency hypotheses,
and an estimation phase (55) including: for each frequency hypothesis: a frequency recalibration (56) of the useful signal depending on the frequency hypothesis, in order to obtain sample sequences, an evaluation (57) of the prob-
(Continued)

Figure 1:
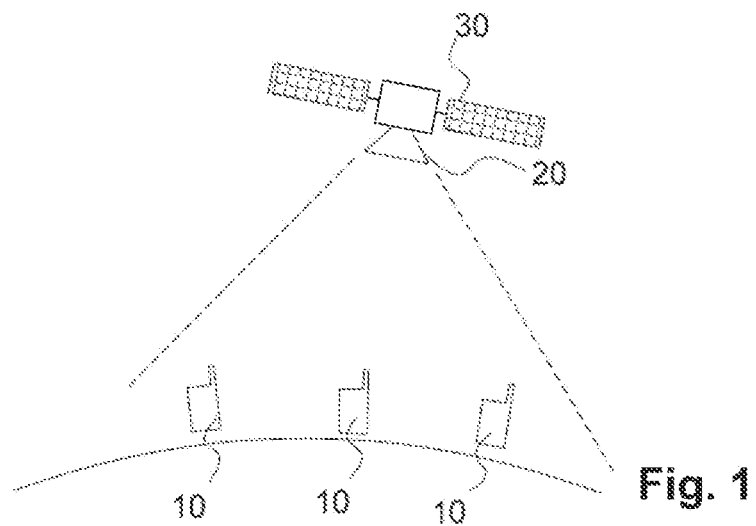

ability of each sample sequence to be a code word of said channel encoder, an estimation (58) of the frequency shift and of the frequency drift depending on the most probable frequency hypothesis.

8 Claims, 2 Drawing Sheets

(52) U.S. Cl.
CPC ............ *H04L 2027/0034* (2013.01); *H04L 2027/0046* (2013.01); *H04L 2027/0065* (2013.01)

(58) Field of Classification Search
CPC .... H04L 2027/0046; H04L 2027/0065; H04B 7/18513; H04W 56/0035; G01R 23/02
See application file for complete search history.

(56) References Cited

U.S. PATENT DOCUMENTS

| | | | |
|---|---|---|---|
| 2008/0143594 | A1 | 6/2008 | Wang et al. |
| 2012/0288037 | A1* | 11/2012 | Patel ............... H04L 25/022 375/340 |
| 2013/0083872 | A1 | 4/2013 | Varikat |

OTHER PUBLICATIONS

Luca Giugno, et al., "Carrier Frequency and Frequency Rate-of-Change Estimators with Preamble-Postamble Pilot Symbol Distribution", Communications, 2005 IEEE International Conference on Seoul, Korea, May 16, 2005, vol. 4, pp. 2478-2482.

Rodrigue Imad, et al., "Blind Estimation of the Phase and Carrier Frequency Offsets for LDPC-Coded Systems", EURASIP Journal on Advances in Signal Processing, Dec. 1, 2010, vol. 2010, No. 1, 14 pages.

Marco Luise, et al., "Carrier Frequency Recovery in All-Digital Modems for Burst-Mode Transmissions", IEEE Transactions on Communications, IEEE Service Center, Feb. 1, 1995, vol. 43, Nos. 2/4, pp. 1169-1178.

Umberto Mengali, et al., "Data-Aided Frequency Estimation for Burst Digital Transmission", IEEE Transactions on Communications, Jan. 1, 1997, vol. 45, No. 1, pp. 23-25.

Le Tian, et al., "An Algorithm for Doppler Shift and Doppler Rate Estimation Based on Pilot Symbols", Consumer Electronics, Communications and Networks (CECNET), 2012 $2^{nd}$ International Conference on, IEEE, Apr. 21, 2012, pp. 1626-1629.

International Search Report and Written Opinion of the ISA for PCT/EP2018/078823 dated Jan. 24, 2019, 18 pages.

\* cited by examiner

METHOD AND RECEIVER DEVICE FOR ESTIMATING A FREQUENCY OFFSET AND A FREQUENCY DRIFT OF A USEFUL SIGNAL

This application is the U.S. national phase of International Application PCT/EP2018/078823 filed Oct. 22, 2018, which designated the U.S. and claims priority to French Patent Application 1760067 filed Oct. 25, 2017, the entire contents of each of which are hereby incorporated by reference.

TECHNICAL FIELD

The present invention belongs to the field of the detection of a useful signal emitted by an emitting device. More particularly, the present invention relates to the detection of useful signals in the case where each useful signal can be assigned with a non-negligible frequency drift, for example greater than a spectral width of said useful signal.

"Spectral width" of the useful signal means the width of the instantaneous frequency spectrum of the useful signal. The spectral width of said useful signal is therefore independent of the frequency drift.

PRIOR ART

Although in no way limiting, the present invention finds a particularly advantageous application in the case of useful signals called "narrow band" useful signals for which the spectral width is typically less than 2 kilohertz, or even less than 1 kilohertz.

In the case of useful narrowband signals, numerous phenomena may introduce a frequency drift that is greater than the spectral width of said useful signals.

First of all, the useful signals being received by a receiving device, relative displacements of the emitting device relative to the receiving device may induce, by Doppler effect, frequency drifts which can prove to be non-negligible compared to the spectral width of the useful signals if relative speeds of displacement are significant. Such frequency drifts can be introduced due to a mobility of the emitting device and/or a mobility of the receiving device.

In particular, in the case of a receiving device on board a satellite in a traveling orbit, for example a low Earth orbit LEO, the speed of travel of said satellite relative to the emitting device (fixed or movable on the surface of the Earth) may introduce non-negligible frequency drifts of the useful signals received at said receiving device.

The frequency drift can also be introduced upon emission, in an uncontrolled manner. Indeed, the emission of a useful signal requires equipping an emitting device with frequency synthesis means (local oscillator, mixer, etc.) implemented to frequency translate the useful signal, generated in baseband, to a frequency band for emitting useful signals. Such frequency synthesis means can introduce a frequency drift which, in particular, in the case of narrowband useful signals, may prove to be non-negligible compared to the spectral width of said useful signals, particularly in the case of low cost emitting devices for which the frequency synthesis means are inefficient. However, the frequency drift introduced by the frequency synthesis means is generally small compared to that generated by the relative displacements of the emitting device relative to the receiving device, particularly if the useful signal is of short duration.

To a lesser extent, the frequency synthesis means of the receiving device can also introduce a frequency drift.

Once a useful signal has been detected by the receiving device, that is to say in particular once the start time of said useful signal has been estimated, it is then necessary to estimate and compensate the frequency drift, but also a frequency shift affecting said useful signal, in order to be able to extract the useful data included in said useful signal.

Estimating the frequency shift and the frequency drift is complex to perform, particularly because it is generally necessary to limit as much as possible the amount of pilot data, known a priori to the receiving device, included in the useful signal, in order to maximise the amount of emitted useful data.

Furthermore, the frequency shift and the frequency drift may have many different values. It is possible to implement estimators in the sense of the maximum likelihood, by testing all the possible values of the frequency shift and all the possible values of the frequency drift. However, the amount of calculations to be performed and the amount of data to be stored is then very large, and can prove to be prohibitive, particularly for the detection of useful signals at a satellite.

DESCRIPTION OF THE INVENTION

The purpose of the present invention is to overcome all or part of the limitations of the solutions of the prior art, in particular those described above, by proposing a solution which allows accurately estimating the frequency shift and the frequency drift affecting a useful signal, while limiting the amount of pilot data to be included in the useful signal and limiting the amount of calculations to be performed compared to an approach testing all the possible values of the frequency shift and the frequency drift.

To this end, and according to a first aspect, the invention relates to a method for estimating a frequency shift and a frequency drift affecting a useful signal received by a receiving device, said useful signal including a code word formed by a channel encoder from useful data. The estimation method includes an analysis phase including:
  for two analysis frequency drifts: a compensation of the considered analysis frequency drift on the useful signal,
  an estimation of the frequency shift on each useful signal obtained after compensation, so as to obtain analysis frequency shifts associated respectively with the analysis frequency drifts, defining two analysis points in a frequency drift/frequency shift plane,
  a selection of frequency hypotheses on a straight line determined by the two analysis points.

The estimation method further includes an estimation phase including:
  for each frequency hypothesis: a frequency recalibration of the useful signal depending on the considered frequency hypothesis, in order to obtain sample sequences associated respectively with the frequency hypotheses,
  an evaluation of the probability of each sample sequence to be a code word of said channel encoder,
  an estimation of the frequency shift and the frequency drift affecting the useful signal depending on the frequency hypothesis associated with the sample sequence having the highest probability of being a code word of the channel encoder.

Thus, the estimation method mainly includes two phases, an analysis phase and an estimation phase.

The analysis phase aims at selecting frequency hypotheses to be tested during the estimation phase, a frequency hypothesis being defined as a pair constituted by a possible value of frequency drift and a possible value of frequency shift or, in other words, a point in a frequency drift/frequency shift plane.

During the analysis phase, two different predetermined analysis frequency drifts are compensated on the useful signal, and two analysis frequency shifts are estimated from the useful signals obtained after compensation. These steps allow obtaining two analysis points in the frequency drift/frequency shift plane.

The number of frequency hypotheses to be tested is then reduced by assuming that the real frequency drift and the real frequency shift affecting the useful signal form a point which must be on the straight line formed, in the frequency drift/frequency shift plane, by the two analysis points. The inventors have found that this hypothesis is particularly well verified in the case where the frequency shift is estimated by means of an unbiased estimator. In the case of a biased estimator, this hypothesis is no longer necessarily verified, but can nevertheless allow acceptable accuracy to be obtained given the reduction in complexity allowed by the reduction in the number of frequency hypotheses to be tested.

During the estimation phase, the different frequency hypotheses are tested by recalibrating the useful signal in frequency and by obtaining, for each frequency hypothesis, a sample sequence supposed to represent a code word of a channel encoder used by the emitting device for forming the useful signal. To determine the most probable frequency hypothesis, the sample sequences obtained are evaluated to determine which corresponds with the highest probability to a code word of the channel encoder.

Thus, the estimation phase can be implemented blindly, without using pilot data, by using the properties of the channel encoder. Indeed, if a frequency hypothesis is not close enough to the real frequency drift and to the real frequency shift affecting the useful signal, then the sample sequence obtained after frequency recalibration should be, in principle, quite far from the code words of the channel encoder and therefore have a low probability of corresponding to a code word of the channel encoder.

In particular embodiments, the estimation method may further include one or more of the following features, considered alone or according to all technically possible combinations.

In particular embodiments, the evaluation of the probability of a sample sequence includes a calculation of a soft syndrome of said sample sequence.

In particular embodiments, the evaluation of the probability of a sample sequence includes, for each sample sequence, a calculation of likelihood of samples, the soft syndrome of said sample sequence being calculated according to the likelihood of said samples.

In particular embodiments, the channel encoder implements a convolutional code, a turbo code or a low density parity check code.

According to a second aspect, the invention relates to a computer program product including a set of program code instructions which, when executed by a processor, configure said processor to implement an estimation method according to any one of the embodiments of the invention.

According to a third aspect, the invention relates to a receiving device including a processing circuit configured to implement an estimation method according to any one of the embodiments of the invention.

According to a fourth aspect, the invention relates to a satellite intended to be placed in a traveling orbit, including a receiving device according to any one of the embodiments of the invention.

PRESENTATION OF THE FIGURES

Figure 2:
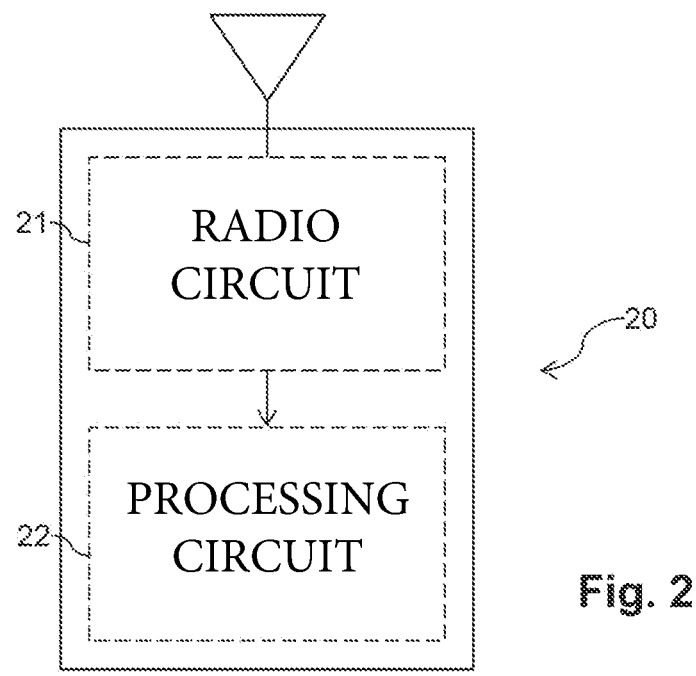
Figure 3:
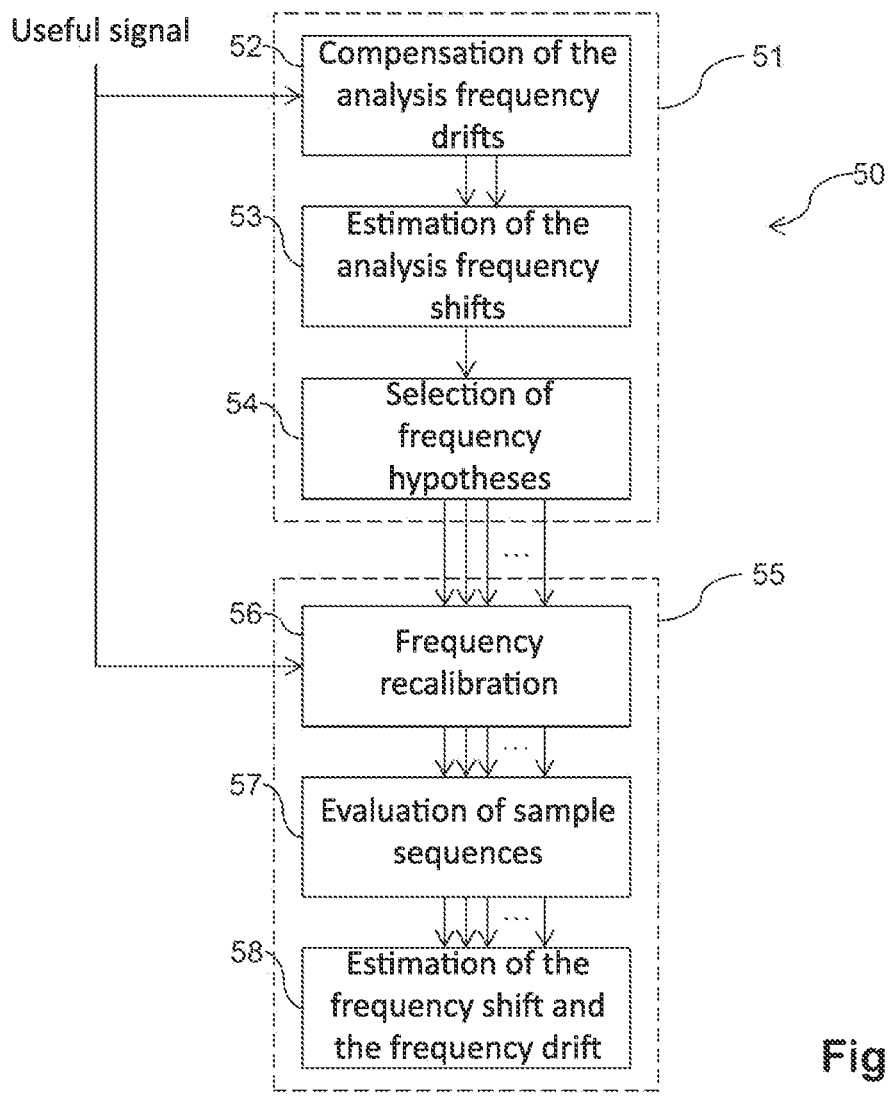
Figure 4:
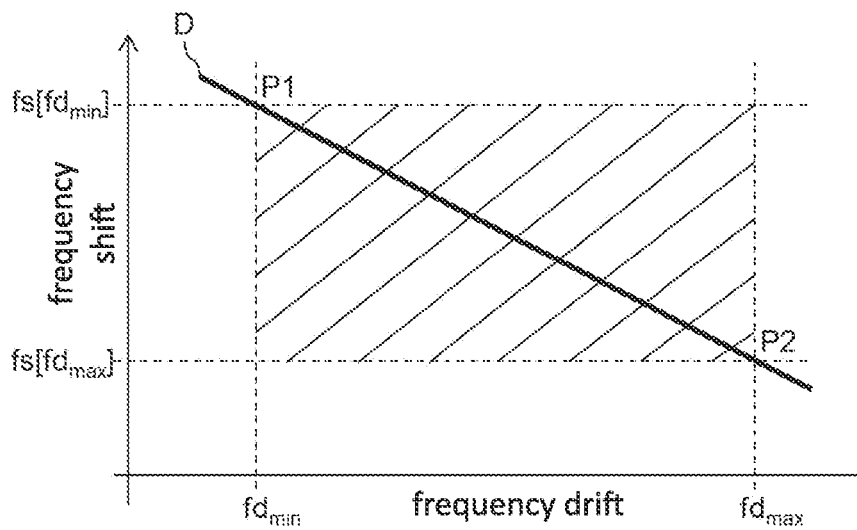

The invention will be better understood upon reading the following description, given by way of non-limiting example, and made with reference to the figures which show:

FIG. 1: a schematic representation of an exemplary embodiment of a system for receiving useful signals, FIG. 2: a schematic representation of an exemplary embodiment of a receiving device, FIG. 3: a diagram showing the main steps of a method for estimating a frequency shift and frequency drift affecting a useful signal according to the invention, FIG. 4: a diagram showing a frequency drift/frequency shift plane and illustrating the selection of frequency hypotheses for the frequency drift and the frequency shift.

In these figures, identical references from one figure to another designate identical or similar elements. For the sake of clarity, the elements shown are not to scale, unless otherwise stated.

DETAILED DESCRIPTION OF EMBODIMENTS

FIG. 1 schematically shows an exemplary embodiment of a system receiving useful signals.

In the non-limiting example illustrated in FIG. 1, the useful signals correspond to radio signals emitted by emitting devices 10 substantially on the surface of the Earth. "Substantially on the surface of the Earth" means that each emitting device 10 is on the ground (terrestrial or marine ground), or else at an altitude in the terrestrial atmosphere (on board an aeroplane, a drone, a balloon, etc.). The useful signals are emitted in a frequency band, and the invention is applicable in any frequency band, in particular the frequency bands traditionally used in terrestrial or satellite telecommunication systems.

A useful signal emitted by an emitting device 10 in particular includes a code word formed by a channel encoder from useful data which must be emitted by the emitting device 10, said useful data not being known a priori to the receiving device 20. In a known manner, a channel encoder adds redundancy to allow, at the receiving device 20, detecting and optionally correcting transmission errors. For example, the channel encoder implements a convolutional code, a turbo-code, a code with Low Density Parity Check (or LDPC), etc.

In the following description, and as illustrated in FIG. 1, the case where the receiving device 20 is on board a satellite 30 in Earth orbit is considered in a non-limiting manner. However, nothing excludes, according to other examples, having a receiving device 20 on board a space or air craft (aeroplane, drone, balloon, etc.). According to other examples, the receiving device 20 can also be on the ground (terrestrial or marine ground) and receive the useful signals directly from the emitting devices 10, or indirectly for example via the satellite 30. The invention is also applicable, in particular, in the case where it is the emitting device 10 which is on board a satellite 30, the receiving device 20 being on the ground.

The satellite 30 is preferably in a traveling orbit, for example in a low altitude orbit LEO ("Low Earth Orbit"). However, nothing excludes considering other types of orbits, for example a medium altitude orbit MEO ("Medium Earth Orbit"), or even a non-traveling orbit such as a geostationary orbit GEO, etc.

Each emitting device 10 can be fixed or movable. Similarly, the receiving device 20 can be fixed or movable.

As indicated above, each useful signal received by the receiving device 20 can be assigned with a frequency drift, for example induced in the example illustrated by FIG. 1 by the traveling of the satellite 30 relative to the emitting devices 10. In following the description, the case where the frequency drift is greater than the spectral width of said useful signal is considered in a non-limiting manner. "Spectral width" of the useful signal means the width of the instantaneous frequency spectrum of the useful signal.

In the following description, considering in a non-limiting manner the case where the useful signals have a narrow band, that is to say of spectral width equal to or less than 2 kilohertz, preferably equal to or less than 1 kilohertz. The invention is also applicable for other types of useful signals, however it is understood that, for such useful signals, a frequency drift can easily become non-negligible.

FIG. 2 schematically shows an exemplary embodiment of a receiving device 20. As illustrated in FIG. 2, the receiving device 20 includes a radio circuit 21 and a processing circuit 22.

The radio circuit 21 includes means, considered to be known to the person skilled in the art, allowing to receive useful signals emitted by emitting devices 10. These means include, in particular, one or more antenna(s), one or more amplifier(s), one or more local oscillator(s), one or more mixer(s), etc.

The processing circuit 22 is adapted in particular to process the useful signals received by the radio circuit 21, optionally after analogue/digital conversion of said useful signals.

The processing circuit 22 includes for example one or more processor(s) and storage media (magnetic hard disk, electronic memory, optical disk, etc.) wherein a computer program product is stored, in the form of a set of program code instructions to be executed to implement, in particular, all or part of the steps of a method 50 for estimating frequency shift and frequency drift affecting a useful signal. Alternatively or in addition, the processing circuit 22 includes one or more programmable logic circuit(s) (FPGA, PLD, etc.), and/or one or more specialised integrated circuit(s) (ASIC), and/or a set of discrete electronic components, etc., adapted to implement all or part of the steps of the estimation method 50.

In other words, the processing circuit 22 corresponds to a set of software (specific computer program product) and/or hardware (FPGA, PLD, ASIC, etc.) configured means to implement the different steps of the estimation method 50.

FIG. 3 shows the main steps of a method 50 for estimating the frequency shift and the frequency drift affecting a useful signal. In principle, the estimation method 50 is implemented after having detected the useful signal for which it is sought to estimate the frequency shift and the frequency drift, and preferably after having estimated the start time of said useful signal (time synchronisation).

As illustrated in FIG. 3, the estimation method 50 mainly includes two phases:

an analysis phase 51 which aims at selecting frequency hypotheses, a frequency hypothesis being defined as a pair constituted by a possible value of a frequency drift and a possible value of a frequency shift or, in other words, a point in a frequency drift/frequency shift plane, an estimation phase 55 which aims at identifying, from the selected frequency hypotheses, the most probable or likely frequency hypothesis in view of the received useful signal.

As illustrated in FIG. 3, the analysis phase 51 includes:

for at least two analysis frequency drifts: a step 52 of compensating the considered analysis frequency drift on the useful signal, a step 53 of estimating the frequency shift on each useful signal obtained after the compensation step 52, so as to obtain analysis frequency shifts associated respectively with the analysis frequency drifts, defining two analysis points P1 and P2 in a frequency drift/frequency shift plane, a step 54 of selecting frequency hypotheses on a straight line determined by the two analysis points.

The estimation phase 55 includes:

for each frequency hypothesis: a step 56 of recalibrating the useful signal in frequency depending on the considered frequency hypothesis, in order to obtain sample sequences associated respectively with the frequency hypotheses, a step 57 of evaluating the probability of each sample sequence to be a code word of said channel encoder, a step 58 of estimating the frequency shift and the frequency drift affecting the useful signal depending on the frequency hypothesis associated with the sample sequence having the highest probability of being a code word of the channel encoder.

Detailed examples of the implementation of the various steps of the analysis phase 51 and the estimation phase 55 will now be described.

A) Analysis Phase

A.1) Compensation of the Analysis Frequency Drifts

As indicated above, the analysis phase 51 includes, for at least two analysis frequency drifts, a step 52 of compensating the considered analysis frequency drift on the useful signal.

In principle, in the case where the frequency drift is induced by the relative displacement of the satellite 30 having the receiving device 20 on-board relative to the emitting device 10, the possible values of the frequency drift are bounded, comprised in a frequency range the bounds of which can be calculated a priori by implementing methods known to the person skilled in the art. Thus, taking into account the speed of travel of the satellite 30 relative to the surface of the Earth, and a maximum distance between a projection on the ground of the trajectory of said satellite 30 and an emitting device 10 which emits a useful signal received by said satellite, it is possible to calculate a priori a maximum value $fd_{max}$ and a minimum value $fd_{min}$ for the possible frequency drifts. In such a case, said analysis frequency drifts preferably correspond respectively to the maximum value $fd_{max}$ and to the minimum value $fd_{min}$ of the frequency drift, or else are comprised in the frequency range defined by said maximum value $fd_{max}$ and said minimum value $fd_{min}$ of the frequency drift.

In the following description, considering in a non-limiting manner the case where the analysis frequency drifts correspond to the maximum value $fd_{max}$ and to the minimum value $fd_{min}$ of the frequency drift, calculated a priori according to the parameters of the receiving system. For example, the minimum value $fd_{min}$ is equal to −15 Hz/s (Hertz per second), and the maximum value $fd_{max}$ is equal to 15 Hz/s.

For example, by designating by s(t) the useful signal received at time t, and by $s_1(t)$ and $s_2(t)$ respectively the useful signals obtained after compensation by the two analysis frequency drifts, the compensation can be performed according to the following expression:

$$s_1(t) = s(t) \cdot \exp(-j \cdot \pi \cdot fd_{min} \cdot t^2)$$

$$s_2(t) = s(t) \cdot \exp(-j \cdot \pi \cdot fd_{max} \cdot t^2)$$

expression wherein:
j is the imaginary unit ($j^2 = -1$),
exp(z) is the exponential function of the value z.

A.2) Estimation of the Analysis Frequency Shifts

As indicated above, the analysis phase 51 further includes a step 53 of estimating the frequency shifts affecting respectively the useful signals $s_1(t)$ and $s_2(t)$ obtained after compensating the analysis frequency drifts on the analysis signal s(t). The frequency shifts thus estimated are designated by analysis frequency shifts.

In preferred embodiments, the analysis frequency shifts are estimated by means of an unbiased estimator. In a general manner, any type of unbiased frequency shift estimator can be implemented during step 53, and the choice of a particular unbiased estimator constitutes only one possible variant implementation. In particular, it is possible, during the estimation step 53, to use pilot data, known a priori to the receiving device 20, possibly included by the emitting device 10 in the useful signal. Non-limiting examples of unbiased frequency shift estimators are for example known from the following scientific publications:

"Data-aided frequency estimation for burts digital transmission", U. Mengali and al., IEEE Transactions on Communications, Vol. 45, No. 1, January 1997, "Carrier frequency recovery in all-digital modems for burst-mode transmissions", M. Luise and al., IEEE Transactions on Communications, Vol. 43, No. 3, March 1995, "Planar filtered techniques for burts mode carrier synchronization", M. P. Fitz, IEEE Globecom'91, Phoenix, December 1991.

At the end of the estimation step 53, there is therefore an analysis frequency shift $fs[fd_{min}]$ estimated from the useful signal $s_1(t)$, and an analysis frequency shift $fs[fd_{max}]$ estimated from the useful signal $s_2(t)$, which define two analysis points P1 and P2 in a frequency drift/frequency shift plane:

$$P1 = (fd_{min}, fs[fd_{min}])$$

$$P2 = (fd_{max}, fs[fd_{max}])$$

A.3) Selection of Frequency Hypotheses

As indicated above, the analysis phase 51 further includes a step 54 of selecting frequency hypotheses. A frequency hypothesis corresponds to a point in a frequency drift/frequency shift plane, to be tested during the estimation phase 55.

In order to reduce the number of frequency hypotheses to be tested during the estimation phase, the frequency hypotheses selected are preferably all points of the straight line defined, in the frequency drift/frequency shift plane, by the analysis points P1 and P2.

FIG. 4 schematically shows the analysis points P1 and P2 in the frequency drift/frequency shift plane, as well as the straight line D defined by said analysis points P1 and P2. By limiting the frequency hypotheses to this straight line, the estimation of the frequency shift and the frequency drift is reduced from a two-dimensional problem (for example search for the best frequency hypothesis in the hatched area defined by the values $fd_{min}$ and $fd_{max}$, and $fs[fd_{max}]$ and $fs[fd_{min}]$) to a one-dimensional problem (for example search for the best frequency hypothesis on the segment defined by the analysis points P1 and P2). The inventors have found that this hypothesis according to which the solution to the problem is on the straight line defined by the analysis points P1 and P2 is particularly well verified in the case where the frequency shift is estimated by means of an unbiased estimator. In the case of a biased estimator, this hypothesis is no longer necessarily verified, but can nevertheless allow having acceptable accuracy to be obtained given the reduction in complexity allowed by the reduction in the number of frequency hypotheses to be tested.

In the case where the analysis frequency drifts correspond to the maximum value $fd_{max}$ and to the minimum value $fd_{min}$ of the frequency drift, the frequency hypotheses are preferably selected on the segment defined by the analysis points P1 and P2.

A number $N_H$ of frequency hypotheses is selected during step 54, the number $N_H$ being for example of the order of a few tens, for example equal to 50. For example, the frequency hypothesis of a rank k ($1 \leq k \leq N_H$) consists of a frequency drift $fd_k$ and a frequency shift $fs_k$ determined according to the following expressions:

$$fd_k = fd_{min} + (k-1) \cdot \frac{fd_{max} - fd_{min}}{N_H - 1}$$

$$fs_k = fs[fd_{min}] + (k-1) \cdot \frac{fs[fd_{max}] - [fd_{min}]}{N_H - 1}$$

With such expressions, the frequency hypothesis of a rank 1 corresponds to the analysis point P1, and the frequency hypothesis of a rank $N_H$ corresponds to the analysis point P2.

B) Estimation Phase

As indicated above, the estimation phase 55 aims at testing the $N_H$ frequency hypotheses selected during the analysis phase 51, in order to identify the most probable or likely frequency hypothesis in view of the received useful signal, which amounts to estimating the frequency shift and the frequency drift affecting said useful signal received by the receiving device 20.

B.1) Frequency Recalibration of the Useful Signal

As indicated above, the estimation phase 55 includes a step 56 of frequency recalibration of the useful signal depending on each frequency hypothesis. The frequency recalibration step 56 is comparable to the analysis phase compensation step 52, except that it aims at compensating both a frequency drift and a frequency shift.

For example, by designating by $s'_k(t)$ the useful signal obtained by frequency recalibration depending on the frequency hypothesis ($fd_k$, $fs_k$) of a rank k ($1 \leq k \leq N_H$), the frequency recalibration can be carried out according to the following expression:

$$s'_k(t) = s(t) \cdot \exp\left(-j \cdot 2\pi \cdot \left(fs_k \cdot t + fd_k \cdot \frac{t^2}{2}\right)\right)$$

In practice, the useful signal is a digital signal, corresponding to the signal s(t) sampled at sampling instants separated by a predefined sampling period $T_E$. In a non-limiting manner, it is considered that the sampling period $T_E$ is equal to a symbol period $T_S$ of the useful signal, which corresponds to the duration between two consecutive symbols of the useful signal. It is however possible to consider a sampling period $T_E$ greater than the symbol period $T_S$. Furthermore, to simplify the equations, only the part of the useful signal which corresponds to the code word formed, at the emitting device 10, by the channel encoder, is considered. The number of symbols forming the code word is designated hereafter by $N_S$, so that the sample sequence $s'_k$ obtained after frequency recalibration depending on the frequency hypothesis ($fd_k$, $fs_k$) of a rank k ($1 \leq k \leq N_H$) can be expressed in the following form ($1 \leq n \leq N_S$):

$$s'_k[n] = s[n] \cdot \exp\left(-j \cdot 2\pi \cdot \left(fs_k \cdot n \cdot T_E + fd_k \cdot \frac{(n \cdot T_E)^2}{2}\right)\right)$$

expression wherein s[n] is equal to $s(n \cdot T_E)$.

The $N_H$ sample sequences $\{s'_k[n], 1 \leq n \leq N_S\}$ ($1 \leq k \leq N_H$) are consequently supposed to correspond to a code word of the channel encoder. It should be noted that, in the case of two-state symbols (for example in the case of a BPSK or "Binary Phase Shift Keying" type modulation), each sample of a sequence represents a bit of the code word. In the case of M state-symbols (M>2), each sample of a sequence represents several bits of the code word. It is then possible, in particular embodiments, to further perform a demodulation of each useful signal obtained after frequency recalibration, in order to obtain a sample sequence including at least one sample per bit of code word. Such demodulation must, where appropriate, be with a soft value output ("soft output demodulation"). However, nothing excludes, according to other examples, considering sample sequences wherein each sample of a sequence represents several bits of the code word.

In the following description, considering in a non-limiting manner the case where the sample sequences $\{s'_k[n], 1 \leq n \leq N_S\}$ ($1 \leq k \leq N_H$) include one sample per bit of code word, so that the number $N_S$ further corresponds to the number of bits of a code word.

B.2) Evaluation of Sample Sequences

As indicated above, the estimation phase 55 then includes a step 57 of evaluating the probability of each sample sequence to be a code word of said channel encoder.

The evaluation step 57 aims at quantifying the probability of each of the $N_H$ sample sequences to correspond to a code word of the channel encoder. Indeed, in a manner known to the person skilled in the art, a channel encoder adds redundancy in a structured manner. Thus, the probability of a sample sequence to correspond to a code word of the channel corresponds to a quantity representative of the measurement wherein which said sample sequence verifies the structure imposed by the channel encoder.

In the case of a linear channel encoder, the structure of said channel encoder is for example determined in a known manner by the parity check matrix of said channel encoder, and the evaluation of each sample sequence can be carried out according to said parity check matrix of said channel encoder.

In order to evaluate the probability of a sample sequence to correspond to a code word of the channel encoder, it is possible to implement methods resulting from the channel encoding theory, and the choice of a particular method constitutes only one possible variant implementation of the evaluation step 57.

For example, it is possible, in preferred embodiments, to calculate a soft syndrome of each sample sequence. An example of soft syndrome calculation is known from the following scientific publication, in the context of an LDPC-type channel encoder and a blind estimation of a frequency shift affecting a useful signal: "Blind estimation of the phase and carrier frequency offset for LDPC coded systems", R. Imad and al., EURASIP Journal on Advances in Signal Processing, Volume 2010, Article ID 293572.

In a manner known to the person skilled in the art, in the case of a linear channel encoder, it is possible to define a parity check matrix H. If the number of bits at the input of the channel encoder is equal to $N_B$ and the number of bits at the output is equal to $N_S$, then the parity check matrix H is of a dimension $(N_S-N_B) \times N_S$. The syndrome $\sigma$ of a sequence r of $N_S$ bits is a vector of a dimension $(N_S-N_B)$, including the elements $\{\sigma[j], 1 \leq j \leq (N_S-N_B)\}$, defined by the following expression:

$$\sigma(r) = r \cdot H^T$$

expression wherein $H^T$ corresponds to the matrix transposed from the parity check matrix H.

If the sequence r of $N_S$ bits is a code word of the channel encoder, then the syndrome $\sigma(r)$ is the zero vector. Otherwise, the syndrome $\sigma(r)$ is different from the zero vector.

Consequently, it is possible during the evaluation step 57, to evaluate the probability of a sample sequence to be a code word as a magnitude of the soft syndrome of said sample sequence. The sample sequence having for example the lowest soft syndrome magnitude can then be considered to be the sample sequence which has the highest probability of being a code word of the channel encoder.

To calculate the soft syndrome of a sample sequence, it is for example possible to calculate a likelihood of each sample of this sequence. Generally, in the field of channel encoders, such a likelihood is calculated in the form of a log-likelihood ratio (see for example the scientific publication mentioned above, by authors R. Imad and al.). The calculation of such likelihoods is considered to be known to the person skilled in the art, and the choice of a particular calculation method constitutes only a variant implementation of the evaluation step 57.

For example, each element $\tilde{\sigma}[p]$ ($1 \leq p \leq (N_S-N_B)$) of the soft syndrome of the sample sequence of a rank k is calculated according to the following expression:

$$\tilde{\sigma}_k[p] = (-1)^{u_p+1} \cdot \arg \tanh\left(\prod_{n=1}^{u_p} \tanh\left(\frac{\tilde{s}_k[p_n]}{2}\right)\right) \quad (1)$$

expression wherein
 tan h(z) is the hyperbolic tangent function of the value z,
 arg tan h(z) is the hyperbolic tangent argument function of the value z, reciprocal function of the hyperbolic tangent function,
 $\tilde{s}_k[n]$ is the likelihood of the element $s'_k[n]$ of a rank n of the sample sequence $s'_k$,
 $p_n$ is the index of the n-th non-zero element of the p-th row of the parity check matrix H,
 $u_p$ is the number of non-zero elements of the p-th row of the parity check matrix H.

To reduce the amount of calculations, it is possible to approach the expression (1) by the following expression:

$$\tilde{\sigma}_k[p] = (-1)^{u_p+1} \cdot \left(\prod_{n=1}^{u_p} \text{sign}(\tilde{s}_k[p_n])\right) \cdot \min_{n=1,\ldots,u_p} |\tilde{s}_k[p_n]| \quad (2)$$

For example, the evaluation of the sample sequence continues by calculating a soft syndrome magnitude. For example, the quantity $\varphi_k$ representative of the probability that the sample sequence s'$_k$, associated with the frequency hypothesis of a rank k, is a code word of the channel encoder is calculated according to the following expression:

$$\varphi_k = \sum_{p=1}^{N_S-N_B} \tilde{\sigma}_k[p] \quad (3)$$

Considering expression (3) above, the most probable sample sequence is then that which minimises the quantity $\varphi_k$.

It should be noted that in the case where the channel encoder is followed by a puncturer, which deletes some bits from the code word upon emission, it is not possible to directly apply the above expression (2). In such a case, it is possible for example to define a partial parity check matrix H', which corresponds to the parity check matrix H from which the columns corresponding to the punctured bits have been deleted. The various elements of the soft syndrome are for example calculated according to the above expression (1). By designating by $N_P$ the number of elements of the soft syndrome ($N_P \leq (N_S - N_B)$), it is then possible to calculate, as a quantity representative of the probability that the sample sequence s'$_k$ is a code word of the channel encoder, the mutual information $IM_k$ carried by this soft syndrome, for example according to the following expression:

$$IM_k = 1 - \frac{1}{N_P} \sum_{p=1}^{N_P} \frac{\exp\left(\frac{|\tilde{\sigma}_k(p)|}{2}\right)}{\exp\left(\frac{|\tilde{\sigma}_k(p)|}{2}\right) + \exp\left(-\frac{|\tilde{\sigma}_k(p)|}{2}\right)} \quad (4)$$

By considering the expression (4) above, the most probable sample sequence is then that which maximises the quantity $IM_k$.

More generally, it is possible to calculate other quantities representative of the probability that a sample sequence is a code word. According to another non-limiting example, it is possible to calculate the minimum distance between the considered sample sequence and a code word of the channel encoder. In such a case, the most probable sample sequence is that which minimises said minimum distance.

B.3) Estimation of the Frequency Shift and the Frequency Drift

As indicated above, the estimation phase 55 further includes a step 58 of estimating the frequency shift and the frequency drift affecting the useful signal.

In practice, the estimated frequency drift and frequency shift preferably correspond to the frequency hypothesis associated with the most probable sample sequence, that is to say having for example minimised the quantity $\varphi_k$ or maximised the quantity $IM_k$. However, it is also possible, according to other examples, to consider for example both frequency hypotheses associated with the two most probable sample sequences, and to estimate for example the frequency drift and the frequency shift as an average (possibly a weighted average) of said two frequency hypotheses if these are close to one another on the straight line D defined by the analysis points P1 and P2.

The invention claimed is:

1. A method for estimating a frequency shift and a frequency drift affecting a useful signal received by a receiving device, said useful signal including a code word formed by a channel encoder from useful data, wherein said method includes:
    an analysis phase including:
        for each of two analysis frequency drifts, compensating for the analysis frequency drift on the useful signal to generate a compensated useful signal,
        estimating a frequency shift on each of the compensated useful signals, so as to obtain analysis of frequency shifts each associated respectively with one of the two analysis frequency drifts, to define two analysis points in a frequency drift/frequency shift plane,
        selecting frequency hypotheses on a straight line determined from the two analysis points, and
    an estimation phase including:
        for each frequency hypothesis among the selected frequency hypotheses, performing a frequency recalibration of the useful signal depending on the frequency hypothesis, to obtain a sample sequence associated with the frequency hypothesis,
        for each of the sample sequences, evaluating a probability of the sample sequence being the code word of said channel encoder,
        estimating a frequency shift and a frequency drift affecting the useful signal depending on the frequency hypothesis associated with one of the sample sequences having a highest probability of being the code word of the channel encoder.

2. The method according to claim 1, wherein the evaluating the probability of each of the sample sequences includes calculating a soft syndrome for each of said sample sequences.

3. The method according to claim 2, wherein each of the sample sequences includes samples, and the evaluating the probability of the sample sequences includes, for each of the sample sequences, calculating a likelihood for each of the samples in the sample sequence and calculating a soft syndrome for the sample sequence according to the likelihoods of said samples in the sample sequence.

4. The method according to claim 1, wherein the channel encoder is a convolutional code, a turbo-code or a low density parity check code.

5. The method according to claim 1, wherein the frequency shift is estimated for each compensated useful signal by an unbiased estimator.

6. A computer program recorded on a non-transitory media readable and executable by a processor, including a set of program code instructions which, when executed by said processor, configure said processor to implement an estimation method according to claim 1.

7. A receiving device, including a processing circuit configured to implement a method for estimating a frequency shift and a frequency drift assigning a useful signal according to claim 1.

8. A satellite intended to be placed in a travelling orbit, including a receiving device according to claim 7.

* * * * *